(12) United States Patent
Lasich (10) Patent No.: US 9,373,739 B2
(45) Date of Patent: Jun. 21, 2016

(54) CONVERSION OF SOLAR ENERGY (75) Inventor: John Beavis Lasich, Balwyn (AU)

(73) Assignee: RAYGEN RESOURCES PTY LTD, Malvern, Victoria (AU)

( * ) Notice: Subject to any disclaimer, the term of this patent is extended or adjusted under 35 U.S.C. 154(b) by 276 days.

(21) Appl. No.: 13/811,760

(22) PCT Filed: Jul. 22, 2011

(86) PCT No.: PCT/AU2011/000928
§ 371 (c)(1),
(2), (4) Date: Apr. 1, 2013

(87) PCT Pub. No.: WO2012/009764
PCT Pub. Date: Jan. 26, 2012

(65) Prior Publication Data
US 2013/0206209 A1 Aug. 15, 2013

Related U.S. Application Data

(60) Provisional application No. 61/367,093, filed on Jul. 23, 2010.

(51) Int. Cl.
| | |
|---|---|
| F03G 6/00 | (2006.01) |
| F03G 7/00 | (2006.01) |
| H01L 31/052 | (2014.01) |
| F24J 2/07 | (2006.01) |
| F24J 2/38 | (2014.01) |
| F24J 2/40 | (2006.01) |
| G05D 3/10 | (2006.01) |
| H01L 31/054 | (2014.01) |
| F24J 2/10 | (2006.01) |

(52) U.S. Cl.
CPC ............ H01L 31/0525 (2013.01); F24J 2/07 (2013.01); F24J 2/38 (2013.01); F24J 2/40 (2013.01); F24J 2/407 (2013.01); G05D 3/105 (2013.01); H01L 31/0547 (2014.12); F24J 2002/1076 (2013.01); Y02E 10/41 (2013.01); Y02E 10/47 (2013.01); Y02E 10/52 (2013.01)

(58) Field of Classification Search
CPC .................. F24J 2/40; F24J 2/07; F24J 2/38; F24J 2/407; F24J 2002/1076; G05D 3/105; H01L 31/0525; Y02E 10/41; Y02E 10/47; Y02E 10/52
USPC .................... 60/641.8–641.15; 136/246, 248; 126/600–607, 572–573, 684, 685
See application file for complete search history.

(56) References Cited

U.S. PATENT DOCUMENTS

| | | | | |
|---|---|---|---|---|
| 6,686,533 | B2 * | 2/2004 | Baum et al. | 136/244 |
| 6,959,993 | B2 * | 11/2005 | Gross et al. | 359/853 |

(Continued)

FOREIGN PATENT DOCUMENTS

WO WO2009/152574 12/2009

OTHER PUBLICATIONS

PCT/CN2011/000928 International Search Report dated Aug. 29, 2011 (3 pages).

*Primary Examiner* — Hoang Nguyen
(74) *Attorney, Agent, or Firm* — Brinks Gilson & Lione; G. Peter Nichols (57) ABSTRACT

A solar energy plant/system includes different combinations of solar energy receivers and arrangements of the receivers that make it possible to optimize solar energy collection and conversion into other forms of energy to maximize value.

22 Claims, 5 Drawing Sheets

(56) References Cited

U.S. PATENT DOCUMENTS

| | | |
|---|---|---|
| 8,033,110 B2 * | 10/2011 | Gilon et al. ............... 60/641.11 |
| 8,122,878 B1 * | 2/2012 | Gross et al. ................. 126/600 |
| 8,365,718 B2 * | 2/2013 | Gilon et al. .................. 126/595 |
| 2009/0229264 A1 | 9/2009 | Gilon et al. |
| 2010/0139644 A1 * | 6/2010 | Schwarzbach et al. ....... 126/573 |

\* cited by examiner

CONVERSION OF SOLAR ENERGY

The present invention relates to collecting and using solar energy.

A major hurdle to widespread use of solar energy is the high cost of solar energy collection and conversion plants and the relatively low output of the currently available options for converting solar energy into other forms of energy.

The present invention provides a solar energy plant/system that comprises different combinations of solar energy receivers and arrangements of the receivers that make it possible to optimize solar energy collection and conversion into other forms of energy to maximise value.

The present invention also provides a multi-type receiver for use in a solar energy plant/system.

The present invention provides a solar energy plant comprising:

(a) a plurality of mirror collectors for collecting solar radiation and selectively directing collected solar radiation, (b) multiple receivers having target areas for receiving solar radiation from the mirror collectors and (i) transferring solar energy to a location or locations within a solar energy plant away from the target areas to use the solar energy directly as solar energy or to convert the solar energy into another form of energy and/or (ii) transferring solar energy to a location or locations away from the plant to use the solar energy directly as solar energy or to convert the solar energy into another form of energy and/or (iii) converting solar energy into other forms of energy at the receivers, and (c) a control system for controlling the orientation of the mirror collectors such that at certain times any mirror collector may be directed towards any of one of the multiple receivers or part thereof.

The present invention also provides a system for using solar energy directly as solar energy and/or converting solar energy into other forms of energy comprising:

(a) a plurality of mirror collectors that is movable to change the orientation of the reflective surfaces of the mirror collectors;

(b) multiple receivers having target areas for receiving solar radiation from the mirror collectors and (i) transferring solar energy to a location or locations within a solar energy plant away from the target areas to use the energy directly as solar energy or to convert the solar energy into another form of energy and/or (ii) transferring solar energy to a location or locations away from the plant to use the solar energy directly as solar energy or to convert the solar energy into another form of energy and/or (iii) converting solar energy into other forms of energy at the receivers; and (c) a control system for controlling the orientation of the mirror collectors for selectively aiming the mirror collectors towards the multiple receivers.

The term "mirror collectors" is understood herein to cover any device that has a reflective surface that can collect and re-direct solar radiation and includes, by way of example, heliostats and Fresnel mirrors.

The term "mirror collectors" may include arrangements that re-direct and/or concentrate solar radiation.

At least one of the receivers may comprise an optical element, such as a mirror, that directs solar radiation that is incident on the element onto the target area of the receiver or onto the target area of another receiver.

The solar plant/system of the present invention may comprise any one or more of the following features:

(a) a photovoltaic receiver and a thermal receiver mounted on one receiver tower or mast in spaced apart relationship so that the operation of one receiver does not interfere with the operation of the other receiver and vice versa, each receiver having target areas for receiving solar radiation from the mirror collectors, (b) a primary receiver (such as a photovoltaic receiver) for receiving solar radiation from the mirror collectors, and a secondary receiver (such as a thermal receiver) for receiving solar radiation reflected or re-directed from the primary receiver, and (c) a photovoltaic receiver and a thermal receiver each of which has a separate target area, with the photovoltaic receiver and the thermal receiver being positioned so that the separate target areas form part of a single target area for receiving solar radiation from the mirror collectors and thereby forming a multi-type receiver, and with the receivers being selected on the basis of optimising the operation limits and responsiveness, as described herein, of the receiver to the flux intensity that is incident on the respective zones of the single target area.

With regard to item (a), the spacing may be selected to be sufficient so that there is no heating or any other unwanted or undesirable influence of one receiver on the other receiver, including components of the receiver such as electrical wiring that causes a loss of performance of the receiver.

With regard to item (b), the secondary receiver may have a complementary responsiveness to the primary receiver. For example, the secondary receiver may be another photovoltaic receiver in a case where the primary receiver is a photovoltaic receiver. For example, in this case, the secondary receiver may be a photovoltaic receiver that has a different band width to the photovoltaic receiver of the primary receiver.

With regard to item (b), the secondary receiver may be positioned on the tower or mast or be remotely positioned on or near the ground for convenience. The primary receiver may be formed to optimise the efficiency of the reflection process, including forming the receiver with such surface shapes as flat, cylindrical, spherical, parabolic, and hyperbolic or providing the surface of the receiver with a suitable reflective coating. The primary receiver may be continuous or faceted. The primary receiver may be a photovoltaic receiver. The secondary receiver may be a thermal receiver. In a situation in which the primary receiver is a photovoltaic receiver, the reflected radiation may include, by way of example only, radiation reflected from any one or more of a front face of a photovoltaic cell of the receiver, a back face of a photovoltaic cell of the receiver, and any other reflective surface of the receiver.

With regard to item (c), typically, solar radiation that is concentrated from a number of collectors, such as heliostats, to a single target area will have a solar flux distribution that has solar flux intensities that increase from the perimeter to the centre of the target area. The applicant has recognized that differences in the responsiveness of different receivers to different flux intensities in such a distribution provides an opportunity to form a single target area that, in effect, has different receiver elements (i.e. different types of sub-receivers) that are optimized for the flux intensities incident on the target area and form, in effect, a multi-type receiver. By way of example, the applicant has recognized that the differences in the operation limits and responsiveness of thermal receivers and photovoltaic receivers (and other types of receivers) to flux intensities provides an opportunity to use thermal receivers and photovoltaic receivers in different zones of a single target area, where the zones have different flux intensities. The term "operation limits and responsiveness" of receivers is understood herein to mean factors that are relevant to operation limits such as radiation intensity, variation in radiation intensity across a zone of a target area, temperature, current density, thermal conductance, and coolant flow rate and factors that are relevant to responsiveness such as ability to capture radiation, receiver cost, conversion efficiency, and the value of energy. By way of example, one factor that may be relevant to a greater of lesser extent in different situations is the responsiveness of receivers to variations in radiation intensity across a zone of a target area. This can be illustrated by reference to the natural intensity distribution in FIG. 3. It can be seen from this figure that there is a significant increase in flux intensity in a relatively short distance in zone 15. A photovoltaic receiver provides greater design flexibility to respond to this intensity variation than other types of receivers, such as thermal receivers. A photovoltaic receiver that has small photovoltaic cell modules connected in parallel is capable of being responsive to this intensity variation. Hence, where there is a significant intensity change in a zone, this is a factor that would suggest that a photovoltaic receiver is a preferred option for that zone. Responsiveness may not be confined to energy conversion. There could be market and timing issues to take into account. Different combinations of receiver elements may be more or less important depending on where a plant is located and the market serviced by the plant. Such elements may take the form of 'modules' which have a common compatible form and are designed to be of appropriate size and configuration to facilitate practical implementation of the 'multi-type' receiver. The invention recognizes that in many instances it is preferable that there be no technology bias towards one receiver type or another receiver type and that any selection should be from all available technology options taking into account the above factors to give the best value.

The thermal receiver may form an outer zone of the single target area and the photovoltaic receiver may form an inner zone of the single target area.

The thermal receiver may form an outer zone of the single target area, a secondary reflective surface or a light guide or other suitable means for transferring solar radiation to another location may form a central zone of the single target area, and the photovoltaic receiver may form an inner zone that is positioned between the outer and the central zones of the single target area The receiver elements may be formed, for example by being shaped (i.e. oriented), to reflect solar radiation from one receiver element to another receiver element in the single target area. This is an appropriate option to maximise the utilisation of solar energy. For example, in a situation where a receiver has separate thermal, photovoltaic and light guide receiver elements that make up a single target area, the thermal receiver element may be shaped or coated with a reflective material to reflect solar radiation from that element to the light guide. For example, the thermal receiver may be adapted to reflect at least 10% of the solar radiation incident on the thermal receiver element. With this arrangement, the initial selection of the types of receiver elements may be based on the solar flux distribution and optimising the selection of the receiver type having regard to the different solar flux zones in the distribution, and further optimisation of use of solar radiation is achieved by arranging one or more of the receiver elements to reflect solar radiation to other elements within the single target area.

In any given situation, the multi-element receiver with a single target area provides opportunities to optimise the geometry of the receiver elements to increase the output/value of the system. The geometry optimisation may include selecting the relative sizes of the different zones 13, 15, 17 and the shape (i.e. orientation) of the receiver elements in these zones. The geometry optimisation may include selecting the shape (i.e. orientation) of the receiver elements with respect to each other to reflect solar radiation form one receiver element onto another element. There could be a range of different angular relationships between the different receiver types. The decisions with respect to the arrangement of the receiver elements will be governed by optimising the flux for the particular receiver and the value of the energy produced.

The control system may be adapted to aim mirror collectors selectively at the different receiver zones or types within the single target zone. Hence, some of the mirror collectors may be aimed selectively at one part of a receiver and other mirror collectors may be aimed selectively at another part of a receiver, etc in the "single" receiver element or sub-receiver zone.

One particular, although not the only, combination of receivers of interest to the applicant is a thermal receiver for converting solar energy into thermal energy at the receiver and a photovoltaic cell receiver for converting solar energy into electrical energy at the receiver.

The control system may be adapted to change the orientation of a reflective surface of each mirror collector independently of the other mirror collectors in the field of mirrors, for example to optimise the output of the receiver or receivers or elements of the receiver or receivers.

The control system may be adapted to change the orientation of the mirror collectors so that one group of mirror collectors is aimed towards one receiver and another group of mirror collectors is aimed at another receiver at the same time.

The control system may be adapted to change the numbers of mirror collectors aimed at the one receiver or another receiver as required.

For example, the control system may be adapted to change the orientation of the mirror collectors to reduce the number of mirror collectors aimed towards one receiver when the solar radiation that is incident on the receiver is above a threshold value.

The plant may comprise a tower or mast that carries the multiple receivers.

The multiple receivers may be separate receivers at different positions at the same height or different heights of the tower or mast, and the control system may be adapted to change the orientation of the mirror collectors vertically to allow the mirror collectors to be aimed selectively at the receivers.

The plant may comprise multiple towers or masts that carry the multiple receivers, and the control system may be adapted to change the orientation of the mirror collectors to one side or the other side to allow the mirror collectors to be aimed selectively at the receivers on different towers.

The receivers on the towers or masts may turn or move through a specific range of movement to enhance the performance (capture of light and production of power/energy).

The control system may be responsive to any suitable set of control rules. The control system rules may be based on maximising energy output from the plant/system. Alternatively, the rules may be based on maximising profit from the plant/system.

More specifically, the factors that may be relevant to the design of the control system may include any one or more of the following factors:

There may be periods of time during a day when the alignment of the Sun and the mirror collectors within the field and a particular receiver are such that the collection efficiency is favorably high.

There may be periods of time during a day when the alignment of the Sun and the mirror collectors within the field and a particular receiver are such that the collection efficiency is high and, as a consequence, a number of mirror collectors can not be used because the intensity on that receiver would be too high. These mirror collectors may be aimed at another receiver of similar or different type.

There may be a synergy between two or more different receivers such that the total value at the energy output is increased by sharing the solar energy between multiple receivers.

In order to facilitate "storage" of energy at different times. This may be time or "tariff" dependent.

When a receiver is a secondary reflector or a light guide which is arranged to transfer light to a remote location.

The receivers may receive energy from another source, such as energy produced by combustion of a fuel such as a combustible gas.

The present invention also provides a method of collecting and using solar energy that comprises:

(a) controlling the orientation of mirror collectors in a solar energy plant and selectively aiming the mirror collectors towards solar energy target areas of multiple solar energy receivers in the plant, and (b) transferring solar energy away from the target areas to a location or locations within the plant and using the solar energy directly as solar energy or converting the solar energy into another form of energy, and/or (c) transferring solar energy to a location or locations away from the plant and using the solar energy directly as solar energy or converting the solar energy into another form of energy and/or (d) converting solar energy into other forms of energy at the receivers.

According to the present invention there is also provided a receiver for a solar energy plant that comprises a combination of different receivers.

The receiver may comprise a target area for solar radiation comprising a plurality of zones, with each zone functioning as a part of a particular receiver.

The selection of the zones may be based on matching the type of receiver in a given zone to the solar flux intensity on that zone.

One particular example of interest to the applicant is a receiver that functions as a thermal receiver for converting solar energy into thermal energy at the receiver and a photovoltaic cell receiver for converting solar energy into electrical energy at the receiver.

Another particular example of interest to the applicant is a receiver that functions as the above-described thermal receiver and photovoltaic cell receiver and as a secondary reflective surface or a light guide or other suitable means for transferring solar radiation to another part of the receiver or location.

The present invention provides a solar energy plant comprising:

(a) a plurality of mirror collectors for collecting solar radiation and selectively directing collected solar radiation, (b) a receiver tower or mast, (c) a photovoltaic receiver and a thermal receiver mounted on the receiver tower in spaced apart relationship so that the operation of one receiver does not interfere with the operation of the other receiver and vice versa, each receiver having target areas for receiving solar radiation from the mirror collectors and (i) transferring solar energy to a location or locations within a solar energy plant away from the target areas to use the solar energy directly as solar energy or to convert the solar energy into another form of energy and/or (ii) transferring solar energy to a location or locations away from the plant to use the solar energy directly as solar energy or to convert the solar energy into another form of energy and/or (iii) converting solar energy into other forms of energy at the receivers, and (d) a control system for controlling the orientation of the mirror collectors such that at certain times any mirror collector may be directed towards any of one of the receivers or part thereof.

The present invention also provides a system for using or transferring solar energy directly as solar energy and/or converting solar energy into other forms of energy comprising:

(a) a plurality of mirror collectors for collecting solar radiation and selectively directing collected solar radiation, (b) a receiver tower or mast, (c) a photovoltaic receiver and a thermal receiver mounted on the receiver tower in spaced apart relationship so that the operation of one receiver does not interfere with the operation of the other receiver and vice versa, each receiver having target areas for receiving solar radiation from the mirror collectors and (i) transferring solar energy to a location or locations within a solar energy plant away from the target areas to use the solar energy directly as solar energy or to convert the solar energy into another form of energy and/or (ii) transferring solar energy to a location or locations away from the plant to use the solar energy directly as solar energy or to convert the solar energy into another form of energy and/or (iii) converting solar energy into other forms of energy at the receivers, and (d) a control system for controlling the orientation of the mirror collectors such that at certain times any mirror collector may be directed towards any of one of the receivers or part thereof.

The present invention also provides a system for using or transferring solar energy directly as solar energy and/or converting solar energy into other forms of energy comprising:

(a) a plurality of mirror collectors that is movable to change the orientation of the reflective surfaces of the mirror collectors;

(b) a receiver tower or mast, (c) a photovoltaic receiver and a thermal receiver mounted on the receiver tower in spaced apart relationship so that the operation of one receiver does not interfere with the operation of the other receiver and vice versa, each receiver having target areas for receiving solar radiation from the mirror collectors and (i) transferring solar energy to a location or locations within a solar energy plant away from the target areas to use the energy directly as solar energy or to convert the solar energy into another form of energy and/or (ii) transferring solar energy to a location or locations away from the plant to use the solar energy directly as solar energy or to convert the solar energy into another form of energy and/or (iii) converting solar energy into other forms of energy at the receivers; and (d) a control system for controlling the orientation of the mirror collectors for selectively aiming the mirror collectors towards the receivers.

The present invention provides a solar energy plant comprising:

(a) a plurality of mirror collectors for collecting solar radiation and selectively directing collected solar radiation, (b) a photovoltaic receiver for receiving solar radiation from the mirror collectors and (i) transferring solar energy from the receiver to a location or locations within a solar energy plant away from the target areas to use the energy directly as solar energy or to convert the solar energy into another form of energy and/or (ii) transferring solar energy to a location or locations away from the plant to use the solar energy directly as solar energy or to convert the solar energy into another form of energy and/or (iii) converting solar energy into other forms of energy at the receiver, and (c) a thermal receiver for receiving solar radiation reflected from the photovoltaic receiver and (i) transferring solar energy from the receiver to a location or locations within a solar energy plant away from the target areas to use the energy directly as solar energy or to convert the solar energy into another form of energy and/or (ii) transferring solar energy to a location or locations away from the plant to use the solar energy directly as solar energy or to convert the solar energy into another form of energy and/or (iii) converting solar energy into other forms of energy at the receiver.

The present invention also provides a system for using or transferring solar energy directly as solar energy and/or converting solar energy into other forms of energy comprising:

(a) a plurality of mirror collectors for collecting solar radiation and selectively directing collected solar radiation, (b) a photovoltaic receiver for receiving solar radiation from the mirror collectors and (i) transferring solar energy from the receiver to a location or locations within a solar energy plant away from the target areas to use the energy directly as solar energy or to convert the solar energy into another form of energy and/or (ii) transferring solar energy to a location or locations away from the plant to use the solar energy directly as solar energy or to convert the solar energy into another form of energy and/or (iii) converting solar energy into other forms of energy at the receiver, and (c) a thermal receiver for receiving solar radiation reflected from the photovoltaic receiver and (i) transferring solar energy from the receiver to a location or locations within a solar energy plant away from the target areas to use the energy directly as solar energy or to convert the solar energy into another form of energy and/or (ii) transferring solar energy to a location or locations away from the plant to use the solar energy directly as solar energy or to convert the solar energy into another form of energy and/or (iii) converting solar energy into other forms of energy at the receiver.

The present invention provides a solar energy plant comprising:

(a) a plurality of mirror collectors for collecting solar radiation and selectively directing collected solar radiation, (b) a photovoltaic receiver and a thermal receiver for receiving solar radiation from the mirror collectors and (i) transferring solar energy from the receiver to a location or locations within a solar energy plant away from the target areas to use the energy directly as solar energy or to convert the solar energy into another form of energy and/or (ii) transferring solar energy to a location or locations away from the plant to use the solar energy directly as solar energy or to convert the solar energy into another form of energy and/or (iii) converting solar energy into other forms of energy at the receiver, with the photovoltaic receiver and the thermal receiver each having a separate target area, with the photovoltaic receiver and the thermal receiver being positioned so that the separate target areas form part of a single target area for receiving solar radiation from the mirror collectors, and with the receivers being selected on the basis of optimising the responsiveness of the elements to the flux intensity that is incident on the respective zones of the single target area.

The present invention also provides a system for using or transferring solar energy directly as solar energy and/or converting solar energy into other forms of energy comprising:

(a) a plurality of mirror collectors for collecting solar radiation and selectively directing collected solar radiation, (b) a photovoltaic receiver and a thermal receiver for receiving solar radiation from the mirror collectors and (i) transferring solar energy from the receiver to a location or locations within a solar energy plant away from the target areas to use the energy directly as solar energy or to convert the solar energy into another form of energy and/or (ii) transferring solar energy to a location or locations away from the plant to use the solar energy directly as solar energy or to convert the solar energy into another form of energy and/or (iii) converting solar energy into other forms of energy at the receiver, with the photovoltaic receiver and the thermal receiver each having a separate target area, with the photovoltaic receiver and the thermal receiver being positioned so that the separate target areas form part of a single target area for receiving solar radiation from the mirror collectors, and with the receivers being selected on the basis of optimising the responsiveness of the elements to the flux intensity that is incident on the respective zones of the single target area.

The present invention also provides a receiver comprising a photovoltaic receiver and a thermal receiver for receiving solar radiation from the mirror collectors and (i) transferring solar energy from the receiver to a location or locations within a solar energy plant away from the target areas to use the energy directly as solar energy or to convert the solar energy into another form of energy and/or (ii) transferring solar energy to a location or locations away from the plant to use the solar energy directly as solar energy or to convert the solar energy into another form of energy and/or (iii) converting solar energy into other forms of energy at the receiver, with the photovoltaic receiver and the thermal receiver each having a separate target area, with the photovoltaic receiver and the thermal receiver being positioned so that the separate target areas form part of a single target area for receiving solar radiation from the mirror collectors, and with the receivers being selected on the basis of optimising the responsiveness of the elements to the flux intensity that is incident on the respective zones of the single target area.

The thermal receiver may form an outer zone of the single target area and the photovoltaic receiver may form an inner zone of the single target area.

The thermal receiver may form an outer zone of the single target area, a secondary reflective surface or a light guide or other suitable means for transferring solar radiation to another location may form a central zone of the single target area, and the photovoltaic receiver may form an inner zone that is positioned between the outer and the central zones of the single target area.

The present invention is described further by way of example with reference to the accompanying drawings, of which:

FIG. 3(*a*) is cross-section along the line x-x in FIG. 3 which illustrates one embodiment of the receiver elements that form the multi-type receiver shown in FIG. 3;

Figure 1:
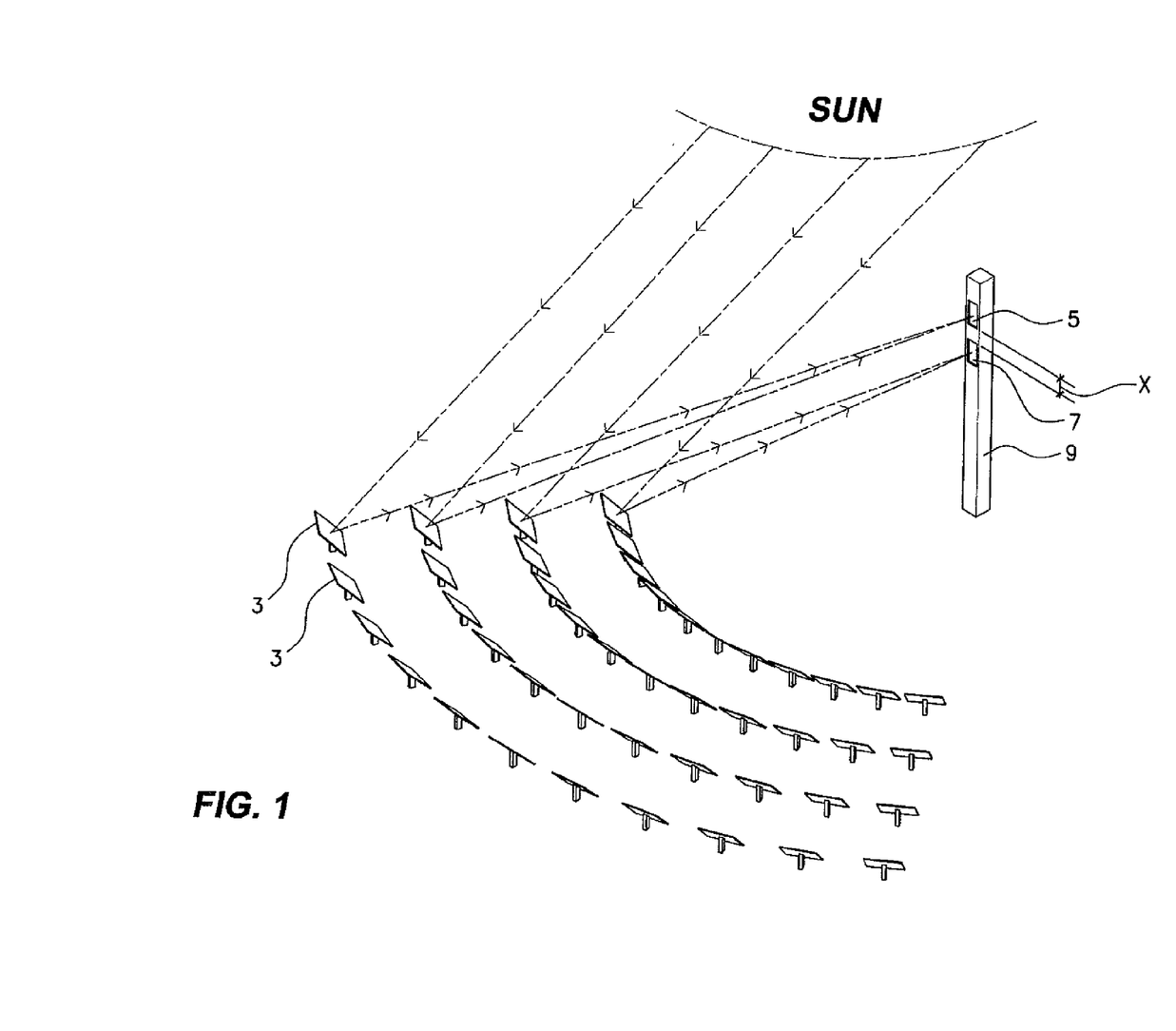
FIG. 1 is a perspective view, in a very simplified and diagrammatic form, of one embodiment of a solar energy plant/system in accordance with the present invention.

The solar energy plant shown in FIG. 1 comprises a plurality of mirror collectors in the form of heliostats 3 that are arranged in an array. The array may be any suitable array. Each collector 3 is arranged so that the orientation of the collector 3 can be changed to track the movement of the Sun and to reflect and to concentrate solar radiation that contacts the collectors 3. The Sun tracking system may be any suitable system.

The plant also includes a tower or mast 9 and an upper solar energy target 5 and a lower solar energy target 7 that are located on the tower 9 to receive solar radiation from the collectors 3. More specifically, in addition to being operable to track the Sun, each collector 3 is arranged so that the orientation of the collector can be changed to direct solar radiation selectively at one or other of the upper target 5 or the lower target 7.

The targets 5, 7 form part of separate solar energy receivers.

The receivers are spaced apart vertically (or may be spaced horizontally) by a distance "X". This distance is selected so that the operation of one receiver does not interfere with the operation of the other receiver and vice versa. In particular, the spacing between the receivers is selected to ensure that heat generated by one receiver does not have an impact on the performance of the other receiver, and vice versa.

The receivers are not illustrated in detail in the Figure other than in a very diagrammatic form. The receivers are discussed in more detail below, as follows.

The receivers may be receivers that can transfer solar radiation from the targets to another location or locations within the plant or to a location or locations away from the plant. For example, the receivers may be secondary reflective surfaces or light guides. The solar energy may be used directly at the other location or locations within the plant or at the location or locations away from the plant, for example by being converted into a different form of energy, such as thermal energy and ultimately electrical energy.

Alternatively, the receivers may be receivers that are adapted for the direct production of other forms of energy via any one or more of photovoltaic methods or thermal methods or thermionic methods or thermo-chemical methods or photonic or photochemical or radiation methods at the receivers or any other suitable method.

Figure 3:
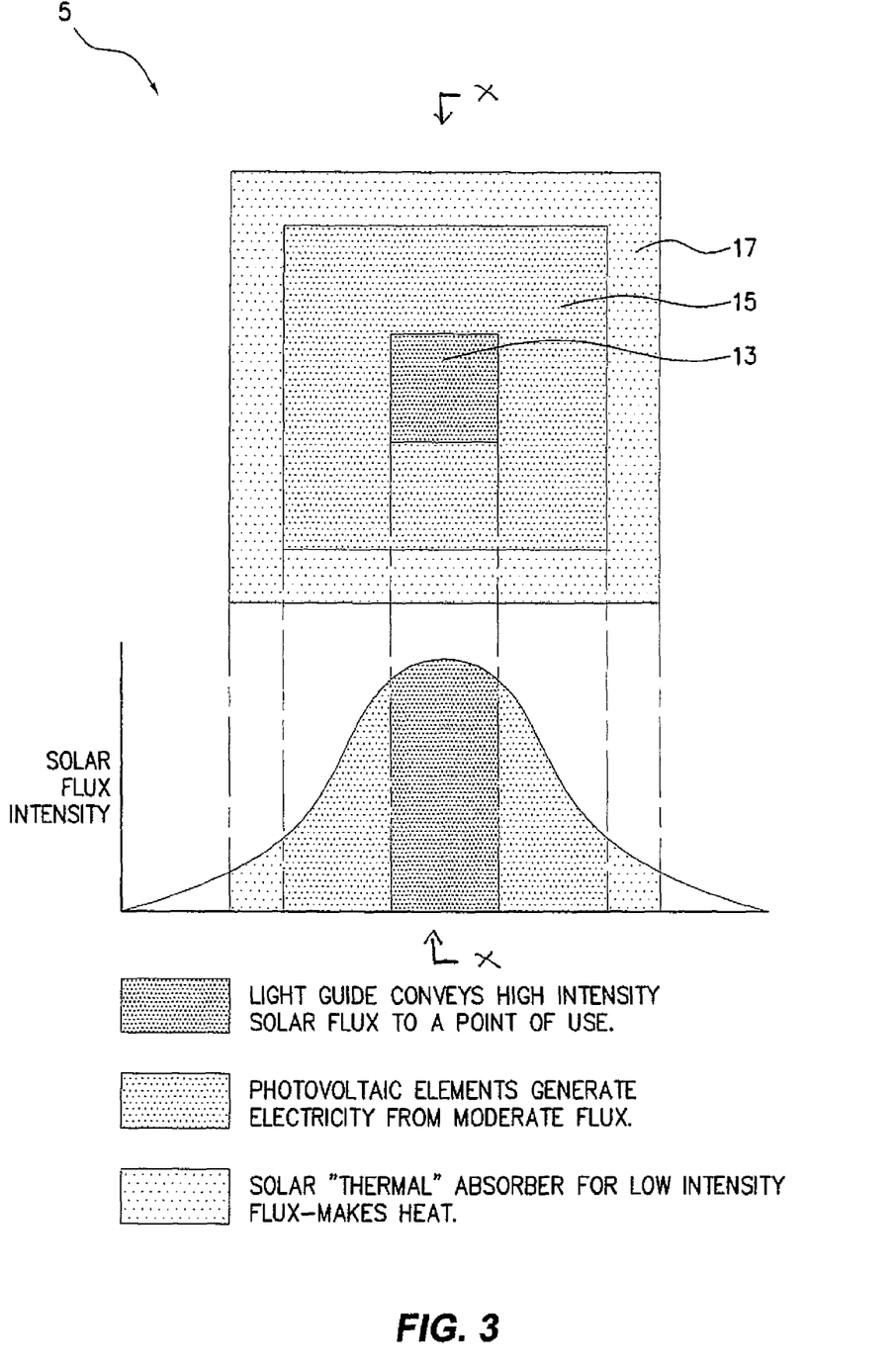
FIG. 3 is a front view of one embodiment of a multi-type receiver that includes a plurality of receivers in accordance with the present invention that could be used in the solar energy plants/systems shown in FIGS. 1 and 2 and in other embodiments of a solar energy plant/system in accordance with the present invention.

Alternatively, the receivers may be receivers that are a combination of different types of receivers that have separate target areas that form a single receiver target area. One example of a target area for such a multi-type receiver is shown in FIG. 3. FIG. 3 is a front view of one embodiment of the receiver. The target area is identified by the numeral 5 in FIG. 3 to simplify the drawing. The target area 5 has three zones. A central zone 13 is a light guide for transferring solar radiation away from the target area to another location within the plant or to a location away from the plant. An intermediate zone 15 that surrounds the central zone 13 is a photovoltaic assembly that converts solar radiation into electrical energy at the receiver. The assembly comprises a plurality of photovoltaic cells that form a front face of the target 5 in the zone 15.

The assembly may be any suitable assembly. An outer zone 17 is a solar-thermal absorber for converting solar energy into thermal energy.

The thermal energy may be used as thermal energy or converted into another form of energy, such as electrical energy, at another location within the plant or a location away from the plant. The solar-thermal absorber may be any suitable absorber. The receivers in the zones 13, 15, 17 may take the form of 'modules' which have a common compatible form and are designed to be of appropriate size and configuration to facilitate practical implementation of the 'multi-type' receiver. The zones 13, 15, 17 and, more particularly, the selection of the different types of receivers for the zones, is based on optimising the use of the solar radiation on the target area. In other words, the selection of the receivers for the zones is driven by the solar radiation that is incident on the zones rather than by a preference for one type of receiver over another type of receiver. One basis for optimisation is solar flux intensity on the target area 5. Typically, there is a higher intensity of solar radiation in the centre of the target area 5 than in outer sections of the target area 5. The graph of solar flux intensity across the width of the target area is a typical intensity distribution. The selection of the zones 13, 15, 17 in FIG. 3 is based on matching the type of receiver in a given zone to the solar flux intensity and thereby optimising the use of the solar energy. This is a quite different approach to receivers known to the applicant. In particular, the solar industry tends to comprise one technology sector that is based on photovoltaic cells and another technology sector that is based on thermal receivers, etc. The applicant has realized that there are benefits in a number of situations in combining these different types of receivers in a single target area to optimize the collection of solar radiation.

Figure 3A:
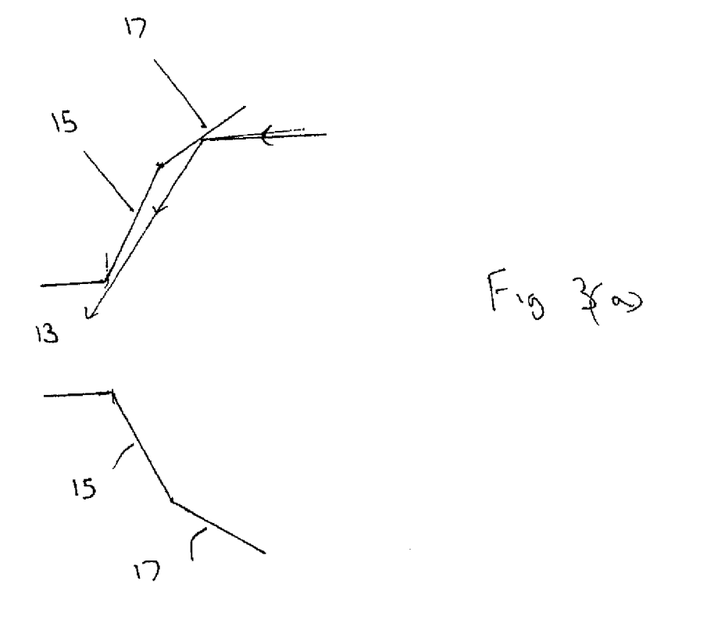
Figure 3B:
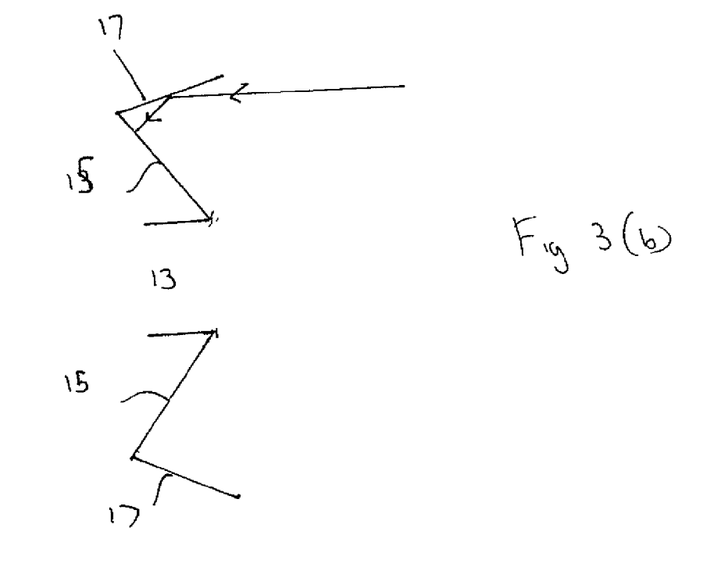
FIG. 3(b) is cross-section along the line x-x in FIG. 3 which illustrates another, although not the only other possible, embodiment of the receiver elements that form the multi-type receiver shown in FIG. 3.

The solar thermal absorber, the photovoltaic assembly, and the light guide that occupy the zones 13, 15, 17 of the target area of the multi-type receiver shown in FIG. 3 may be any suitable construction. By way of example, the solar thermal absorber and the photovoltaic assembly may have flat front surfaces and be co-planar. However, the present invention is not limited to this arrangement and also extends to arrangements in which one or more than one of the receiver elements in the zones 13, 15, 17 is shaped to reflect solar radiation from one receiver element to another receiver element. This is an appropriate option to maximise the utilisation of solar energy. For example, in a situation as shown in FIG. 3 where a multi-type receiver has separate thermal, photovoltaic and light guide receiver elements in zones 13, 15, 17 that make up a single target area, the thermal receiver element in zone 17 may be shaped to reflect solar radiation from that element to the light guide in zone 13. This feature optimises the use of solar radiation in the multi-type receiver. Two embodiments of such multi-type receivers are illustrated in FIGS. 3(a) and 3(b). In the embodiment shown in FIG. 3(a), the thermal receiver element in zone 17 is positioned in relation to the light guide in zone 13 so that solar radiation reflects off the surface of the thermal receiver into the light guide. This is illustrated by the arrowed line in the Figure. In the embodiment shown in FIG. 3(b), the thermal receiver element in zone 17 is positioned in relation to the photovoltaic receiver element in zone 15 so that solar radiation reflects off the surface of the thermal receiver onto the photovoltaic receiver element. This is illustrated by the arrowed line in the Figure.

The plant shown in FIG. 1 includes a control system that selectively aims each collector 3 at one or other of the targets 5, 7 depending on a range of factors.

The factors may vary between different locations for the plant, with some factors being more important for one location than for another location and vice versa.

The factors may include the factors described in the dot points set out above. The factors may also include other factors, such as the time that is required to physically change the orientation of one or more collectors.

The control system includes a computer processor that receives input data, such as weather conditions on a real time basis and forecast weather conditions for later points in time, real time data on the intensity of solar radiation on the targets, 5, 7, information on the actual and projected requirements for the solar energy on a real time basis and at later points in time, and information on the prices of different forms of energy. The computer processor stores a model that takes into account the relevant control factors to the plant and processes the input data and activates drive systems that selectively orient the collectors 3 into required positions. The control system continues to receive the input data and re-position one or more mirror collectors, as may be required.

Figure 2:
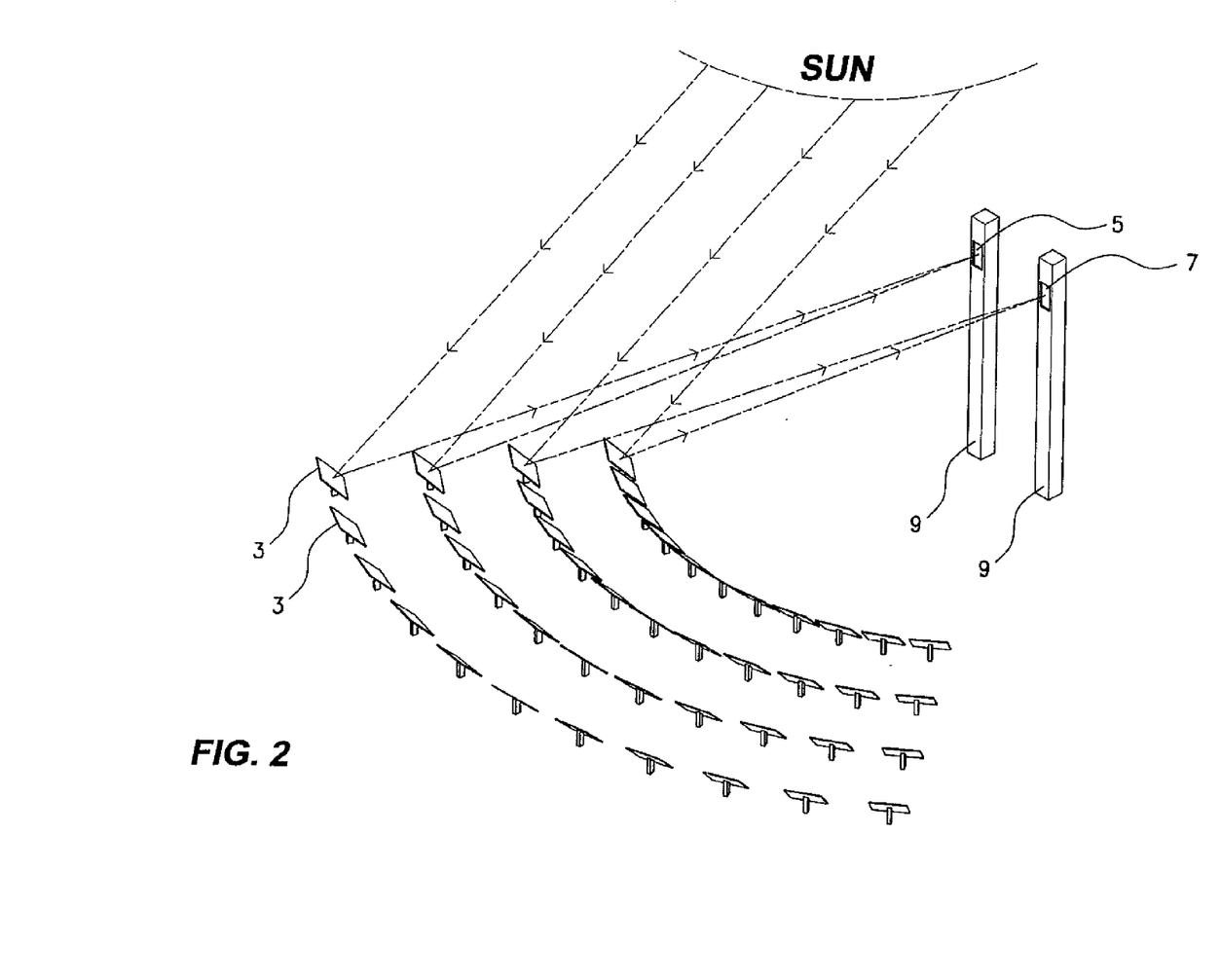
FIG. 2 is a perspective view, in a very simplified and diagrammatic form, of another (although not the only other) embodiment of a solar energy plant/system in accordance with the present invention.

The solar energy plant shown in FIG. 2 is identical to the plant shown in FIG. 1 in terms of the basic components of the plant and the same reference numerals are used to describe the same components.

The main difference between the two embodiments is that the FIG. 2 plant has two towers or masts 9 and one of the target areas 5 is located on one of the towers or masts and the other target area 7 is located on the other target area.

Figure 4:
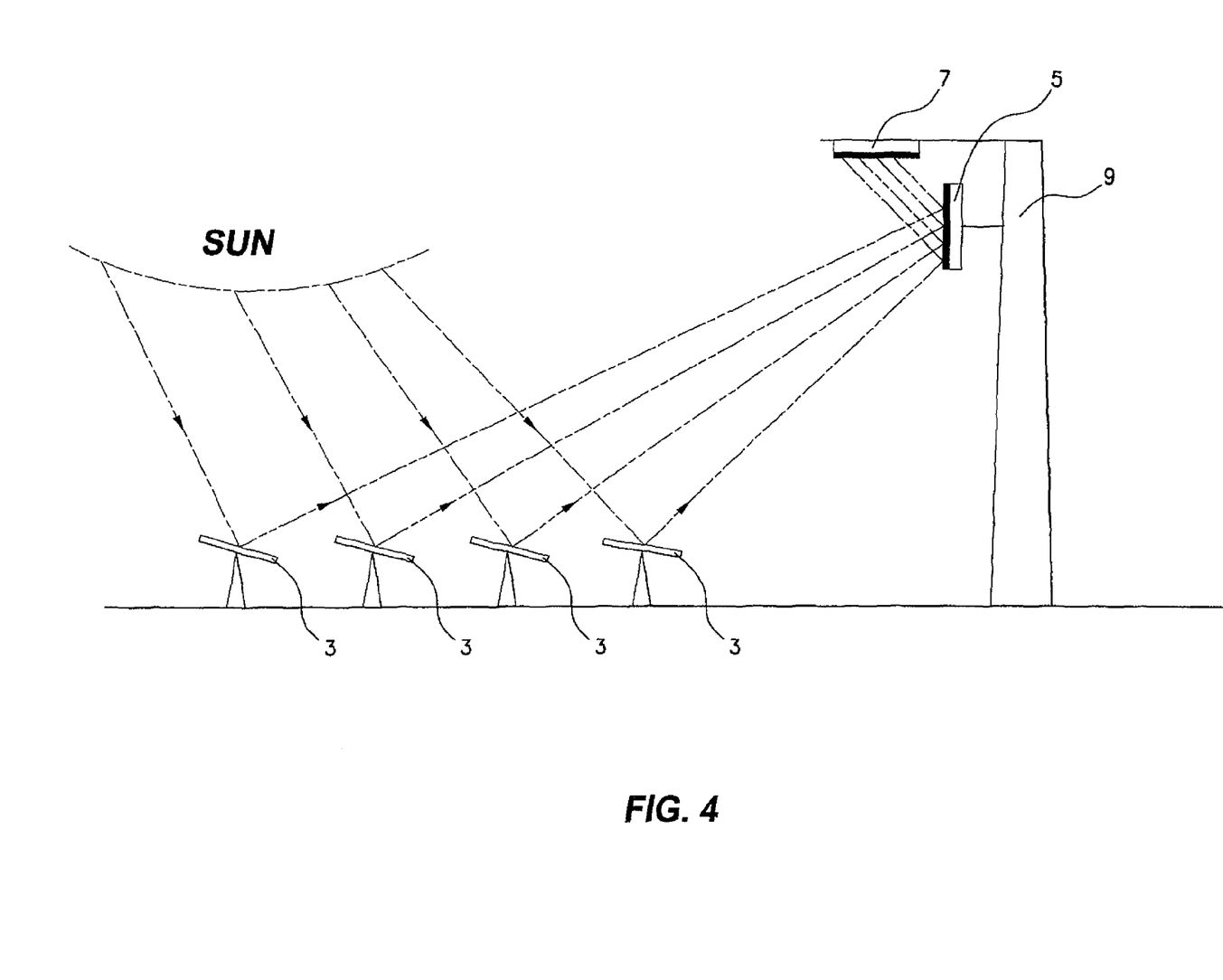
FIG. 4 is a side view, in very simplified and diagrammatic form, of another (although not the only other) embodiment of a solar energy plant/system in accordance with the present invention.

The solar energy plant shown in FIG. 4 has the same basic components as the plants shown in FIGS. 1 and 2 and the same reference numerals are used to describe the same components.

The plant shown in FIG. 4 comprises a plurality of mirror collectors in the form of heliostats 3 that are arranged in an array. The array may be any suitable array. Each collector 3 is arranged so that the orientation of the collector 3 can be changed to track the movement of the Sun and to reflect and to concentrate solar radiation that contacts the collectors 3. The Sun tracking system may be any suitable system.

The plant also includes a tower or mast 9 and a primary solar energy receiver 5 (which in this embodiment is in the form of a photovoltaic receiver) and a secondary solar energy receiver 7 (which in this embodiment is in the form of a thermal receiver) that are located on the tower or mast 9. The solar receiver 5 is arranged to receive solar radiation from the collectors 3. The thermal receiver 7 is arranged to receive reflected solar radiation from the solar receiver 5. The receivers 5, 7 are spaced apart a sufficient distance so that there is minimal if any affect of heat or other outputs of one receiver on the other receiver and vice versa. Depending on the circumstances, typically 2-16% of the solar radiation that is incident on the photovoltaic receiver 5 may be reflected from the photovoltaic receiver 5 onto the thermal receiver 7. The amount of reflected radiation may be greater than 16%. The photovoltaic receiver 5 may be formed to optimise the efficiency of the reflection process. For example, the photovoltaic receiver 5 may be formed with exterior surface shapes such as flat, cylindrical, spherical, parabolic, and hyperbolic shapes as required given the plant construction or the surface of the receiver may have a suitable reflective coating. Depending on the circumstances, the reflected solar radiation that is incident on the thermal receiver 7 may be sufficient to heat fluids in the thermal receiver to temperatures up to 500° C. or more. At these temperatures, there is substantial potential for using the heated fluid productively. In addition, the heated fluids may be suitable for other applications such as facilitating operation of other processes/devices, including electrochemical processes and/or storage devices.

The secondary solar energy receiver 7 may be positioned on the tower or mast, as shown in FIG. 4. Alternatively, the secondary solar energy receiver 7 may be remotely positioned on or near the ground for convenience. In such an arrangement, the positions of the primary solar energy receiver 5 and the secondary solar energy receiver 7 will have to be selected to provide the required light path from one receiver to the other receiver.

Many modifications may be made to the present invention described above without departing from the spirit and scope of the invention.

By way of example, whilst not described, the receivers shown in the Figures may comprise an optical element, such as a mirror that directs solar radiation that is incident on the element onto the target area of the receiver or onto the target area of another receiver.

By way of further example, whilst not described, the tower or mast may be used to support some other energy receiving or transmitting or converting device, such as a wind turbine. The system may be arranged to integrate the output from these multiple sources of energy.

By way of further example, each receiver element of the thermal/photovoltaic/light guide receiver element combination that forms the multi-element receiver shown in FIG. 3 may comprise a plurality of modules that form a "plug-in" arrangement, whereby each of these solar energy conversion modules may have a common form and shape and compatible operating characteristics for use in a close packed receiver unit.

By way of further example, the receivers could also include a reflector around the perimeters of the receivers which are optimised to reflect light onto selected target areas (such as one or more than one of the light guide, photovoltaic, and thermal receiver elements of the embodiment shown in FIG. 3). There could also be a reflector that, in effect, has reflective and thermal characteristics (which allow it to act as a combination reflector/thermal receiver).

The invention claimed is:

1. A solar energy plant comprising:
   (a) a plurality of mirror collectors for collecting solar radiation and selectively directing collected solar radiation,
   (b) multiple receivers having target areas for receiving solar radiation from the mirror collectors and (i) transferring solar energy to a location or locations within a solar energy plant away from the target areas to use the solar energy directly as solar energy or to convert the solar energy into another form of energy and/or (ii) transferring solar energy to a location or locations away from the plant to use the solar energy directly as solar energy or to convert the solar energy into another form of energy and/or (iii) converting solar energy into other forms of energy at the receivers, wherein the multiple receivers comprise a photovoltaic receiver and a thermal receiver each of which has a separate target area, with the photovoltaic receiver and the thermal receiver being positioned so that the separate target areas form part of a single target area for receiving solar radiation from the mirror collectors, and with the receivers being selected on the basis of optimizing the responsiveness of the receivers to the flux intensity that is incident on the respective target areas of the single target area; and
   (c) a control system for controlling the orientation of the mirror collectors such that at certain times any mirror collector may be directed towards any of one of the multiple receivers or part thereof.

2. The plant defined in claim 1 wherein the photovoltaic receiver and the thermal receiver are mounted on one receiver tower or mast in spaced apart relationship so that the operation of one receiver does not interfere with the operation of the other receiver and vice versa, each receiver having target areas for receiving solar radiation from the mirror collectors.

3. The plant defined in claim 2 wherein the spacing is selected to be sufficient so that there is no heating or other undesirable influence of one receiver on the other receiver, including components of the receiver such as electrical wiring, that causes a loss of performance of the receiver.

4. The plant defined in claim 1 wherein at least one of the receivers comprises an optical element that directs solar radiation that is incident on the element onto the target area of the receiver or onto the target area of another receiver.

5. The plant defined in claim 1 wherein the multiple receivers comprise a primary receiver and a secondary receiver that has a complementary responsiveness to the primary receiver for receiving solar radiation reflected or re-directed from the primary receiver.

6. The plant defined in claim 5 wherein the primary receiver is a photovoltaic receiver and the secondary receiver is a thermal receiver that is adapted to receive solar radiation reflected or re-directed from the photovoltaic receiver.

7. The plant defined in claim 5 wherein the primary receiver is a photovoltaic receiver and the secondary receiver is a photovoltaic receiver that is adapted to receive solar radiation reflected or re-directed from the photovoltaic receiver of the primary receiver, with photovoltaic receiver of the secondary receiver having a different band width to the photovoltaic receiver of the primary receiver.

8. The plant defined in claim 5 wherein the primary receiver is a photovoltaic receiver and the reflected radiation from the photovoltaic receiver includes radiation reflected from any one or more of a front face of a photovoltaic cell of the photovoltaic receiver, a back face of a photovoltaic cell of the photovoltaic receiver, and any other reflective surface of the photovoltaic receiver.

9. The plant defined in claim 5 wherein the primary receiver is formed to optimize the efficiency of the reflection process, including forming the receiver with such surface shapes as flat, cylindrical, spherical, parabolic, and hyperbolic shapes or providing the surface of the receiver with a suitable reflective coating.

10. The plant defined in claim 1 wherein the thermal receiver forms an outer zone of the single target area and the photovoltaic receiver forms an inner zone of the single target area.

11. The plant defined in claim 1 wherein the thermal receiver forms an outer zone of the single target area, a secondary reflective surface or a light guide or other suitable means for transferring solar radiation to another location forms a central zone of the single target area, and the photovoltaic receiver forms an inner zone that is positioned between the outer and the central zones of the single target area.

12. The plant defined in claim 1 wherein at least one of the receiver elements of the single target area is formed to reflect solar radiation from one receiver element to another receiver element.

13. The plant defined in claim 1 wherein the control system is adapted to aim mirror collectors selectively at the different receiver types within the single target zone.

14. The plant defined in claim 1 wherein the thermal receiver is operable for converting solar energy into thermal energy at the receiver and the photovoltaic receiver is operable for converting solar energy into electrical energy at the receiver.

15. The plant defined in claim 1 wherein one receiver is a thermal receiver for converting solar energy into thermal energy at the receiver and another receiver is a photovoltaic cell receiver for converting solar energy into electrical energy at the receiver.

16. The plant defined in claim 1 wherein the control system is adapted to change the orientation of a reflective surface of each mirror collector independently of the other mirror collectors in the field of mirrors.

17. The plant defined in claim 1 wherein the control system is adapted to change the orientation of the mirror collectors so that one group of mirror collectors is aimed towards one receiver and another group of mirror collectors is aimed at another receiver at the same time.

18. The plant defined in claim 1 wherein the control system is adapted to change the numbers of mirror collectors aimed at the one receiver or another receiver as required.

19. The plant defined in claim 1 comprises a tower or a mast that carries the multiple receivers.

20. The plant defined in claim 19 comprises separate receivers at different positions at the same height or different heights of the tower or mast, and the control system is adapted to change the orientation of the mirror collectors vertically to allow the mirror collectors to be aimed selectively at the receivers.

21. The plant defined in claim 1 wherein the thermal receiver is operable for converting solar energy into thermal energy at the receiver and the photovoltaic receiver is operable for converting solar energy into electrical energy at the receiver.

22. A method of collecting and using solar energy that comprises:
 (a) controlling the orientation of mirror collectors in a solar energy plant and selectively aiming the mirror collectors towards solar energy target areas of multiple solar energy receivers defined in claim 1, and
 (b) transferring solar energy away from the target areas to a location or locations within the plant and using the solar energy directly as solar energy or converting the solar energy into another form of energy, and/or
 (c) transferring solar energy to a location or locations away from the plant and using the solar energy directly as solar energy or converting the solar energy into another form of energy and/or
 (d) converting solar energy into other forms of energy at the receivers.

* * * * *